(12) United States Patent
Sunaga et al.

(10) Patent No.: US 6,922,291 B2
(45) Date of Patent: Jul. 26, 2005

(54) CATOPTRIC PROJECTION OPTICAL SYSTEM AND EXPOSURE APPARATUS

(75) Inventors: Toshihiro Sunaga, Tochigi (JP); Koshi Hatakeyama, Tochigi (JP); Takahiro Sasaki, Toshigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/783,536

(22) Filed: Feb. 20, 2004

(65) Prior Publication Data

US 2004/0165282 A1 Aug. 26, 2004

(30) Foreign Application Priority Data

Feb. 21, 2003 (JP) ........................................ 2003-044886

(51) Int. Cl.[7] .............................. G02B 17/00; G02B 5/10
(52) U.S. Cl. ........................ 359/726; 359/858; 359/861
(58) Field of Search ................................ 359/631, 633, 359/727, 728, 729, 730, 731, 726, 856–861; 355/53, 55, 67, 77

(56) References Cited

U.S. PATENT DOCUMENTS

| | | | | |
|---|---|---|---|---|
| 4,701,035 A | * | 10/1987 | Hirose | 359/366 |
| 5,815,310 A | * | 9/1998 | Williamson | 359/365 |
| 6,033,079 A | | 3/2000 | Hudyma | 359/857 |
| 6,172,825 B1 | | 1/2001 | Takahashi | 359/859 |
| 6,302,548 B2 | * | 10/2001 | Takahashi et al. | 359/858 |
| 6,353,470 B1 | | 3/2002 | Dinger | 355/71 |

FOREIGN PATENT DOCUMENTS

| | | |
|---|---|---|
| EP | 0 779 528 A2 | 6/1997 |
| JP | 2000-100694 | 4/2000 |
| JP | 2000-235144 | 8/2000 |

OTHER PUBLICATIONS

European Patent Office; "European Search Report"; of corresponding European Patent Application No. EP 04 25 0867; dated Jun. 28, 2004; (3 pages).
English abstract of JP 2000–235144.
English abstract of JP 2000–100694.

* cited by examiner

*Primary Examiner*—Georgia Epps
*Assistant Examiner*—M. Hasan
(74) *Attorney, Agent, or Firm*—Morgan & Finnegan, LLP (57) ABSTRACT

A catoptric projection optical system for projecting a reduced size of a pattern on an object surface onto an image surface and for serving as an imaging system that forms an intermediate image between the object surface and image surface, includes six or more mirrors, wherein a position of an exit pupil with respect to the intermediate image is located between the object surface and image surface, and wherein the largest angle between principal rays and an optical axis for angles of view at the position of the exit pupil is $\sin^{-1}NA$ or smaller, where NA is a numerical aperture at the side of the image surface.

18 Claims, 4 Drawing Sheets

CATOPTRIC PROJECTION OPTICAL SYSTEM AND EXPOSURE APPARATUS

This application claims a benefit of priority based on Japanese Patent Application No. 2003-044886, filed on Feb. 21, 2003, which is hereby incorporated by reference herein in its entirety as if fully set forth herein.

BACKGROUND OF THE INVENTION

The present invention relates generally to an exposure apparatus, and more particularly to a reflection type or catoptric projection optical system, and an exposure apparatus using the same which use ultraviolet ("UV") and extreme ultraviolet ("EUV") light to expose an object, such as a single crystal substrate for a semiconductor wafer, and a glass plate for a liquid crystal display ("LCD").

Recent demands for smaller and lower profile electronic devices have increasingly demanded finer semiconductor devices to be mounted onto these electronic devices. For example, the design rule for mask patterns has required that an image with a size of a line and space ("L & S") of less than 0.1 μm be extensively formed. It is expected to require circuit patterns of less than 80 nm in the near future. L & S denotes an image projected onto a wafer in exposure with equal line and space widths, and serves as an index of exposure resolution.

A projection exposure apparatus as a typical exposure apparatus for fabricating semiconductor devices includes a projection optical system for exposing a pattern on a mask or a reticle, onto a wafer. The following equation defines the resolution R of the projection exposure apparatus (i.e., a minimum size for a precise image transfer) where λ is a light-source wavelength and NA is a numerical aperture of the projection optical system:

$$R = k_1 \times \frac{\lambda}{NA} \quad (1)$$

As the shorter the wavelength becomes and the higher the NA increases, the higher or finer the resolution becomes. The recent trend has required that the resolution be a smaller value; however it is difficult to meet this requirement using only the increased NA, and the improved resolution expects use of a shortened wavelength. Exposure light sources have currently been in transition from KrF excimer laser (with a wavelength of approximately 248 nm) and ArF excimer laser (with a wavelength of approximately 193 nm) to $F_2$ excimer laser (with a wavelength of approximately 157 nm). Practical use of the EUV light is being promoted as a light source.

As a shorter wavelength of light narrows usable glass materials for transmitting the light, it is advantageous for the projection optical system to use reflective elements, i.e., mirrors instead of refractive elements, i.e., lenses. No applicable glass materials have been proposed for the EUV light as exposure light, and a projection optical system cannot include any lenses. It has thus been proposed to form a catoptric projection optical system only with mirrors (e.g., multilayer mirrors).

A mirror in a catoptric reduction projection optical system forms a multilayer coating to enhance reflected light and increase reflectance, but the smaller number of mirrors is desirable to increase reflectance for the entire optical system. In addition, the projection optical system preferably uses the even number of mirrors to avoid mechanical interference between a mask and wafer by arranging them at opposite sides with respect to a pupil.

As the EUV exposure apparatus has requires a smaller critical dimension or resolution than a conventional one, higher NA is necessary (e.g., up to 0.2 for a wavelength of 13.4 nm). Nevertheless, conventional three or four mirrors have a difficulty in reducing wave front aberration. Accordingly, the increased number of mirrors, such as six, as well as use of an aspheric mirror, is needed so as to increase the degree of freedom in correcting the wave front aberration. Hereinafter, such an optical system is referred to as a six-mirror system in the instant application. The six-mirror system has been disclosed, for example, in Japanese Patent Applications, Publication Nos. 2000-100694 and 2000-235144.

Japanese Patent Application Publication No. 2000-100694 discloses some six-mirror catoptric projection optical systems with significantly large structures, because a fourth mirror M4 has a maximum effective diameter of 540 mm or greater relative to NA=0.2. Among the embodiments, the largest maximum effective diameter exceeds 650 mm relative to NA=0.28. The mirror's maximum effective diameter increases with NA. The mirror having the maximum effective diameter is arranged just before an intermediate image forming position, and the effective diameter increases because of large angles of view at the intermediate image forming position. In order for a ray from the fourth mirror M4 to a fifth mirror M5 not to interfere with a sixth mirror M6, these angles are inevitably large and becomes larger than $\sin^{-1}NA$.

On the other hand, Japanese Patent Application Publication No. 2000-235144 discloses a catoptric projection optical system that has small angles of view at the intermediate image forming position. In general, an effective diameter increases with a distance from a pupil, and a distant exit pupil from the intermediate image enlarges an effective diameter relative to small NA, such as NA=0.14.

BRIEF SUMMARY OF THE INVENTION

Accordingly, it is an exemplified object of the present invention to provide a six-mirror catoptric projection optical system with a high NA and excellent imaging performance, and an exposure apparatus using the same, which are applicable to the EUV lithography, and reduce a maximum effective diameter and an overall length of the optical system.

A catoptric projection optical system of one aspect according to the present invention for projecting a reduced size of a pattern on an object surface onto an image surface and for serving as an imaging system that forms an intermediate image between the object surface and image surface, includes six or more mirrors, wherein a position of an exit pupil with respect to the intermediate image is located between the object surface and image surface, and wherein the largest angle between principal rays and an optical axis for angles of view at the position of the exit pupil is $\sin^{-1}NA$ or smaller, where NA is a numerical aperture at the side of the image surface.

The numerical aperture may be greater than 0.2. The mirror that forms the intermediate image may be located at a position of an aperture stop. The intermediate image may be formed on an optical path between a second mirror from the object surface, and a second mirror from the image surface. The principal ray for each angle of view at the position of the intermediate image may go away from the optical axis. The six or more mirrors may form a coaxial system. All of the six or more mirrors may be aspheric mirrors including a multilayer coating that reflect light having a wavelength of 20 nm or smaller.

A reflection mask may be arranged on the object surface. The catoptric projection optical system may be non-telecentric at a side of object surface. Light incident upon a first mirror on an optical path from the object surface may have an incident angle between 5° and 10°. An exposure area at a side of the image surface may have a slit width of 0.8 mm or greater.

The catoptric projection optical system may include, in order of sequential reflections of light from the object surface, a first mirror, a second mirror, a third mirror, a fourth mirror, a fifth mirror, and a sixth mirror, wherein the second mirror, the first mirror, the sixth mirror, the third mirror, and the fifth mirror are arranged in this order from the object surface to the image surface, and wherein said catoptric projection optical system forms the intermediate image between the fourth mirror and the third mirror. The catoptric projection optical system may include only six mirrors or reflective surfaces.

An exposure apparatus of another aspect according to the present invention includes the above catoptric projection optical system, a mask stage that supports a mask having the pattern, and positions the pattern on the mask onto the object surface, a wafer stage that supports an object having a photosensitive layer, and positions the photosensitive layer on the image surface, and a mechanism for synchronously scanning said mask stage and said wafer stage while the mask is illuminated by light having a wavelength of 20 nm or smaller.

An exposure apparatus still another aspect according to the present invention includes an illumination optical system for illuminating a pattern with light from a light source, and the above catoptric projection optical system. The projection optical system may project light reflected on the pattern, onto the image surface.

A device fabricating method includes the steps of exposing an object using the above exposure apparatus, and developing the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

In providing a six-mirror catoptric projection optical system with a high NA and excellent imaging performance, and an exposure apparatus using the same, which are applicable to the EUV lithography, and reduce a maximum effective diameter and an overall length of the optical system, the instant inventor has earnestly studied a mirror's effective diameter, and discovered that a small angle of a principal ray at an intermediate image position (smaller than $\sin^{-1}NA$) and a small distance between the intermediate image position and the exit pupil contribute to a reduction of the effective diameter.

Figure 1:
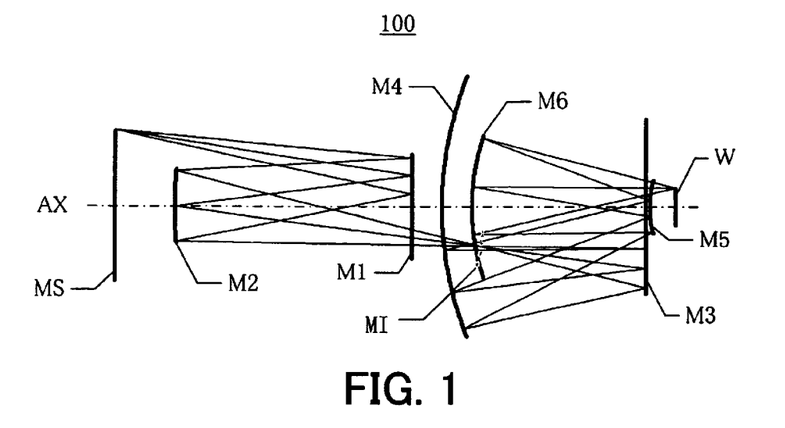
FIG. 1 is a schematic structure of a catoptric projection optical system of one embodiment according to the present invention.
Figure 2:
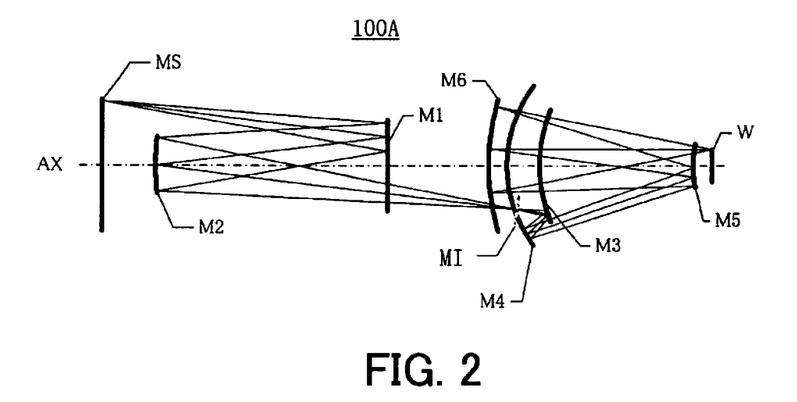
FIG. 2 is a schematic structure of a catoptric projection optical system of another embodiment according to the present invention.

A description will now be given of catoptric projection optical systems 100 and 100A and an exposure apparatus 200 as one aspect of the present invention with reference to the accompanying drawings. The same reference numeral in each figure denotes the same element, and a description thereof will be omitted. Here, FIG. 1 is a schematic structure of the catoptric projection optical system 100. FIG. 2 is a schematic structure of the catoptric projection optical system 100A. Unless otherwise specified, the catoptric projection optical system 100 generalizes the catoptric reduction projection optical system 100A.

Referring to FIG. 1, the inventive catoptric projection optical system 100 has six mirrors including, in order of sequential reflections of light from an object surface MS, a first (convex) mirror M1, a second (concave) mirror M2, a third mirror M3, a fourth (concave) mirror M4, a fifth (convex) mirror M5, and a sixth (concave) mirror M6. The first and second mirrors M1 and M2 form an intermediate image MI, which is in turn re-imaged on an image surface M by the third to six mirrors M3 to M6.

The catoptric projection optical system 100 maintains an angle of the principal ray at the intermediate image MI position to be $\sin^{-1}NA$ or smaller, and arranges the exit pupil close to the intermediate image MI position. Thereby, the catoptric projection optical system 100 can maintain the mirror's maximum effective diameter to be small. When the angle of the principal ray at the intermediate image MI position is greater than $\sin^{-1}NA$, the effective diameter becomes too large relative to NA. The intermediate image MI position located approximately at a center of the optical system can minimize effective diameters of front and back mirrors of the intermediate image MI. Thus, the exit pupil position on the intermediate image MI surface is preferably located between the object surface MS and the image surface W.

The catoptric projection optical system 100 is so non-telecentric that light incident upon the first mirror M1 from the object surface MS has an incident angle of 5° or greater. In addition, the catoptric projection optical system 100 is telecentric with respect to the exit light at the image surface W side. For example, the object surface MS side needs a certain incident angle, in order to illuminate a mask arranged on the object surface MS through an illumination optical system, and to form an image on a wafer located at the image surface W. On the other hand, the image surface W side is preferably telecentric to reduce a change of magnification, for example, when the wafer located at the object surface MS moves in the optical axis direction.

The inventive projection optical system 100 is arranged substantially as a coaxial optical system that is axially symmetrical around one optical axis, has an advantage in that a ring-shape image surface around the optical axis can preferably correct aberration. However, the six mirrors in the catoptric projection optical system 100 do not have to be arranged perfectly coaxial for aberrational corrections or adjustments. For example, they may slightly decenter for aberrational improvements or improve the degree of freedom in arrangement.

The catoptric projection optical system is indispensable to the EUV optical system, and required to reduce light shielding at the image surface W side as higher NA is demanded. The instant embodiment forms the intermediate image MI near the sixth mirror M6, and prevents interference between the light and mirror.

Although the catoptric projection optical system 100 includes six mirrors, but needs at least one or more aspheric mirrors. A shape of the aspheric surface in these first to sixth mirrors 110 to 160 is defined as Equation 2 as an equation of a generic aspheric surface. As a mirror having an aspheric surface advantageously facilitates a correction of aberration, the aspheric surface is preferably applied to many possible (desirably, six) mirrors. The catoptric projection optical system 100 is not limited to a six-mirror system, but may include six or more mirrors for high performance and high NA.

$$Z = \frac{ch^2}{1 + \sqrt{1-(1+k)c^2h^2}} + Ah^4 + Bh^6 + Ch^8 + Dh^{10} + Eh^{12} + Fh^{14} + Gh^{16} + Hh^{18} + Jh^{20} + \ldots \quad (2)$$

where "Z" is a coordinate in an optical-axis direction, "c" is a curvature (i.e., a reciprocal number of the radius r of curvature), "h" is a height from the optical axis, "k" a conic constant, "A" to "J" are aspheric coefficients of $4^{th}$ order, $6^{th}$ order, $8^{th}$ order, $10^{th}$ order, $12^{th}$ order, $14^{th}$ order, $16^{th}$ order, $18^{th}$ order, $20^{th}$ order, respectively.

The catoptric projection optical system 100 arranges an aperture stop on the second mirror M2, but may arrange the aperture stop between the first and second mirrors M1 and M2 or on the first mirror M1. The aperture stop arranged on the second mirror M2 facilitates a reduction of the light shielding, and can use a circular aperture stop. The aperture stop may have a variable or fixed diameter. When the variable diameter is used, a variation of the aperture stop's diameter would advantageously provide a deep depth of focus, thereby stabilizing images.

A multilayer coating for reflecting the EUV light is applied onto a surface of each of the first to sixth mirrors M1 to M6, and serves to enhance the light. A multilayer coating that can reflect the EUV light having a wavelength of 20 nm or smaller can include, for example, a Mo/Si multilayer coating including alternately laminated molybdenum (Mo) and silicon (Si) layers or a Mo/Be multilayer coating including alternately laminating molybdenum (Mo) and beryllium (Be) layers. An optimal material is selected according to wavelengths to be used. Of course, the present invention does not limit the multilayer coating to the above materials, and may use any multilayer coating that has an operation or effect similar to that of the above.

Referring now to FIGS. 1 and 2, a description will now be given of illumination experiment results using the inventive catoptric projection optical systems 100 and 100A. In FIGS. 1 and 2, MS is a reflection mask located at the object surface, and W is a wafer located at the image surface.

The catoptric projection optical systems 100 and 100A illuminate the mask MS using an illumination system (not shown) for emitting the EUV light with a wavelength of about 13.4 nm, and reflects the reflected EUV light from the mask MS via the first (convex) mirror M1, the second (concave) mirror M2, the third (convex) (plane) mirror M3, the fourth (concave) mirror M4, the fifth (convex) mirror M5, and the sixth (concave) mirror in this order. Then, a reduced image of the mask pattern is formed on the wafer W located at the image surface.

The catoptric projection optical system 100 forms, as shown in FIG. 1, the intermediate image MI near the sixth mirror M6, the light from the second mirror M2 to the third mirror M2 intersects the light from the fourth mirror M4 to the fifth mirror M5. The catoptric projection optical system 100A forms the intermediate image MI near the sixth mirror M6, as shown in FIG. 6.

The catoptric projection optical system 100 shown in FIG. 1 has a numerical aperture at the image side NA=0.24, a reduction=¼, an object point of 128 to 136 mm, and an arc-shaped image surface with a width of 8 mm. Table 1 indicates the numerical values (such as radius of curvature, surface intervals, and coefficients of aspheric surfaces) of the catoptric projection optical system 100 shown in FIG. 1.

TABLE 1

| MIRROR NUMBERS | RADII OF CURVATURE (mm) | SURFACE INTERVALS (mm) |
|---|---|---|
| OBJECT MASK (MS) | ∞ | 491.891 |
| M1 | 3842.27 | −391.891 |
| M2 | 623.53 | 782.331 |
| M3 | ∞ | −340.568 |
| M4 | 587.99 | 347.083 |
| M5 | 179.044 | −296.955 |
| M6 | 384.583 | 340.955 |
| WAFER (W) | ∞ | |

TABLE 1-continued

| COEFFICIENTS OF ASPHERIC SURFACES | K | A | B | C |
|---|---|---|---|---|
| M1 | −267.4660 | −7.80044E−09 | 4.13260E−13 | 8.21038E−17 |
| M2 | −2.6284 | 1.71127E−09 | −1.04963E−14 | 2.16368E−19 |
| M3 | 0.0000 | −1.81104E−09 | 3.54552E−14 | −6.56727E−19 |
| M4 | −0.5015 | −4.99639E−11 | 5.51481E−16 | 6.21448E−20 |
| M5 | 0.6522 | 1.28818E−08 | −1.22531E−12 | 1.27459E−16 |
| M6 | 0.0422 | 6.31614E−11 | 1.18303E−15 | 2.63860E−20 |
|  | D | E | F | G |
| M1 | −2.00255E−20 | 3.40696E−24 | −3.40597E−28 | 2.05891E−32 |
| M2 | −7.05067E−22 | 4.59327E−25 | −1.40249E−28 | 1.68151E−32 |
| M3 | 2.52501E−23 | −2.93865E−28 | −1.06101E−31 | 8.25731E−36 |
| M4 | −6.85647E−25 | −5.48455E−30 | 4.97703E−34 | −6.55281E−39 |
| M5 | 1.57925E−19 | −2.65980E−22 | 1.88753E−25 | −7.15690E−29 |
| M6 | −5.53148E−24 | 9.53036E−28 | −8.41706E−32 | 3.83038E−36 |

Table 2 shows aberration in the catoptric projection optical system 100 shown in FIG. 1 for each angle of view without manufacture errors:

TABLE 2

| OBJECT POINT (mm) | WAVE FRONT ABERRATION (rms) |
|---|---|
| 128 | 0.0633λ |
| 132 | 0.0450λ |
| 136 | 0.0870λ |

|MAXIMUM DISTORTION VALUE| = 0.93 nm

The exit pupil at the intermediate image MI position is located on the second mirror M2 between the object surface MS and the image surface W. In addition, the largest angle between principal rays and an optical axis for angles of view at the intermediate image MI position is 8.07°, thus smaller than $\sin^{-1}NA=13.89$, meeting a condition to reduce the maximum effective diameter. The fourth mirror M4 has the maximum effective diameter of 427.3 mm, which is sufficiently small.

The catoptric projection optical system 100A shown in FIG. 2 has a numerical aperture at the image side NA=0.2, a reduction=¼, an object point of 158 to 162 mm, and an arc-shaped image surface with a width of 4 mm. Table 3 indicates the numerical values (such as radius of curvature, surface intervals, and coefficients of aspheric surfaces) of the catoptric projection optical system 100A shown in FIG. 2.

TABLE 3

| MIRROR NUMBERS | RADII OF CURVATURE (mm) | SURFACE INTERVALS (mm) |
|---|---|---|
| OBJECT MASK (MS) | ∞ | 658.261 |
| M1 | ∞ | −532.963 |
| M2 | 968.525 | 887.03 |
| M3 | 302.215 | −76.293 |
| M4 | 302.887 | 433.456 |
| M5 | 279.794 | −475.793 |
| M6 | 557.573 | 519.793 |
| WAFER (W) | ∞ |  |

| COEFFICIENTS OF ASPHERIC SURFACES | K | A | B | C |
|---|---|---|---|---|
| M1 | 7.88620E+09 | 9.98468E−10 | 2.76930E−14 | −8.19354E−19 |
| M2 | 0.5761 | 7.20732E−11 | −4.05948E−15 | 2.32861E−18 |
| M3 | 0.1784 | −1.54481E−08 | 6.76525E−14 | −2.59281E−18 |
| M4 | −0.1083 | −1.76254E−10 | −3.18389E−14 | 9.47733E−19 |
| M5 | 0.8599 | 1.00000E−08 | −4.51956E−13 | 2.13913E−16 |
| M6 | 0.0201 | 1.59132E−11 | 1.23333E−16 | 2.95498E−21 |
|  | D | E | F | G |
| M1 | 4.22975E−23 | 8.12933E−28 | −1.70222E−31 | 4.00669E−36 |
| M2 | −1.42724E−21 | 4.69821E−25 | −7.93226E−29 | 5.38998E−33 |
| M3 | 4.52462E−22 | −1.08110E−26 | −5.23843E−31 | 2.31444E−35 |
| M4 | −8.85221E−24 | −4.22779E−29 | 2.24402E−33 | 1.92390E−38 |
| M5 | −1.30190E−19 | 4.66867E−23 | −1.02050E−26 | 1.08018E−30 |
| M6 | −2.10152E−25 | 1.06111E−29 | −2.59576E−34 | 2.33651E−39 |

Table 4 shows aberration in the catoptric projection optical system 100A shown in FIG. 2 for each angle of view without manufacture errors:

TABLE 4

| OBJECT POINT (mm) | WAVE FRONT ABERRATION (rms) |
|---|---|
| 158 | 0.0766λ |
| 160 | 0.0361λ |
| 162 | 0.0697λ |

|MAXIMUM DISTORTION VALUE| = 6.2 nm

The exit pupil at the intermediate image MI position is located on the second mirror M2, between the object surface MS and the image surface W. In addition, the largest angle between principal rays and an optical axis for angles of view at the intermediate image MI position is 7.5°, thus smaller than $\sin^{-1}NA=11.54$, meeting a condition to reduce the maximum effective diameter. The fourth mirror M4 has the maximum effective diameter of 364.26 mm, which is sufficiently small.

As discussed, the catoptric projection optical systems 100 and 100A include six or more mirrors with small diameter and high NA, can use the EUV light, and provide excellent imaging performance. These optical systems 100 and 100A can reduce the maximum effective diameters, realize an optical system having a small overall length, and miniaturize an apparatus.

Figure 3:
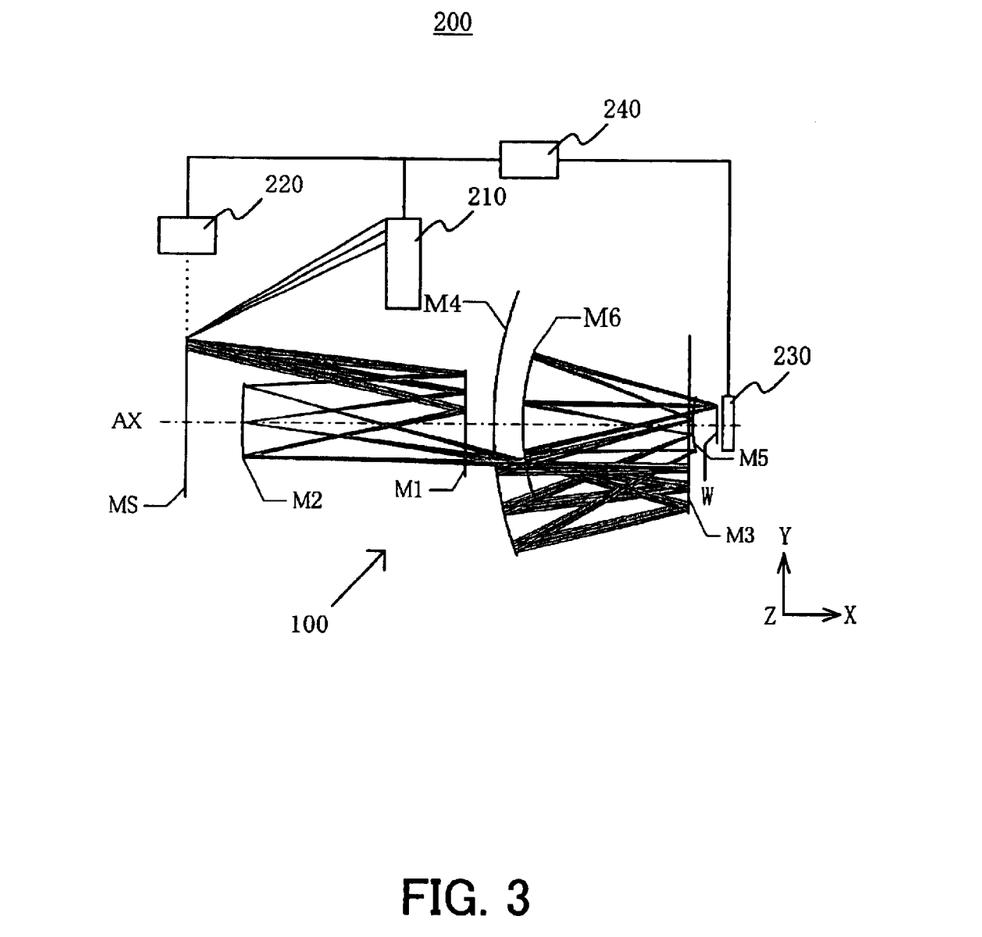
FIG. 3 is a schematic structure of an exposure apparatus that includes the catoptric projection optical system shown in FIG. 1.

Referring now to FIG. 3, a description will now be given of the exposure apparatus 200. FIG. 3 is a schematic structure of the exposure apparatus 200. The exposure apparatus 200 is a projection exposure apparatus that uses the EUV light (with a wavelength of, e.g., 13.4 nm) as illumination light for exposure, and provides a step-and-scan exposure.

The exposure apparatus 200 includes, as shown in FIG. 3, an illumination apparatus 210, a mask MS, a mask stage 220 mounted with the mask MS, a catoptric projection optical system 100, an object W, a wafer stage 230 mounted with the object W, and a controller 240. The controller 240 is connected controllably to the illumination apparatus 210, the mask stage 220 and the wafer stage 230.

At least the optical path through which the EUV light travels should preferably be maintained in a vacuum atmosphere, although not shown in FIG. 3, since the EUV light has low transmittance for air. In FIG. 3, XYZ defines a three-dimensional space, and the direction Z is a normal direction to the XY plane.

The illumination apparatus 210 uses circular EUV light (with a wavelength of, for example, 13.4 nm) corresponding to a circular field of the reflection type projection optical system, to illuminate the mask MS, and includes a light source and illumination optical system (not shown). The illumination apparatus 210 may use any technology known in the art for the light source and illumination optical system, and a detailed description thereof will be omitted. For example, the illumination optical system may include a condenser optical system, an optical integrator, an aperture stop, a blade, etc., and use any technique conceivable to those skilled in the art.

The mask MS is a reflection or transmission mask, and forms a circuit pattern (or image) to be transferred. It is supported and driven by a mask stage 220. The diffracted light emitted from the mask MS is projected onto the object W after reflected by the projection optical system 100. The mask MS and object W are arranged optically conjugate with each other. Since the exposure apparatus 200 is a step-and-scan exposure apparatus, the mask MS and object W are scanned to transfer the pattern on the mask MS, onto the object W.

The mask stage 220 supports the mask MS and is connected to a mobile mechanism (not shown). The mask stage 220 may use any structure known in the art. The mobile mechanism (not show) may use a linear motor, etc., and drives the mask stage 220 in the direction Y so as to move the mask MS under control by the controller 240. The exposure apparatus 200 scans while synchronizes the mask MS and object W through the controller 240.

The catoptric projection optical system 100 is an optical system that reduces and projects a pattern on the mask MS onto the image surface. The reflection type projection optical system 100 may use any of the above embodiments, and a detailed description thereof will be omitted. Although FIG. 3 uses the reflection type optical system 100 shown in FIG. 1, the present invention is not limited to this illustrative embodiment.

The object W is a wafer in this embodiment, but may be a LCD and another object to be exposed. Photoresist is applied to the object W.

The object W is supported by the wafer stage 230. For example, the wafer stage 230 uses a linear motor to move the object W in XYZ directions. The mask MS and object W are, for example, scanned synchronously under control by the controller 240, and the positions of the mask stage 220 and wafer stage 230 are monitored, for example, by a laser interferometer and the like, so that both are driven at a constant speed ratio.

The controller 240 includes a CPU and memory (not shown) and controls operations of the exposure apparatus 200. The controller 240 is electrically connected to (a mobile mechanism (not shown) for) the mask stage 220, and (a mobile mechanism (not shown) for) the wafer stage 230. The CPU includes a processor regardless of its name, such as an MPU, and controls each module. The memory includes a ROM and RAM, and stores a firmware for controlling the operations of the exposure apparatus 200.

In exposure, the EUV light emitted from the illumination apparatus 210 illuminates the mask MS, and the pattern on the mask MS onto the object W. The instant embodiment provides a circular or ring-shaped image surface, and scans the entire surface on the mask MS by scanning the mask MS and object W with a speed ratio corresponding to the reduction ratio.

Figure 4:
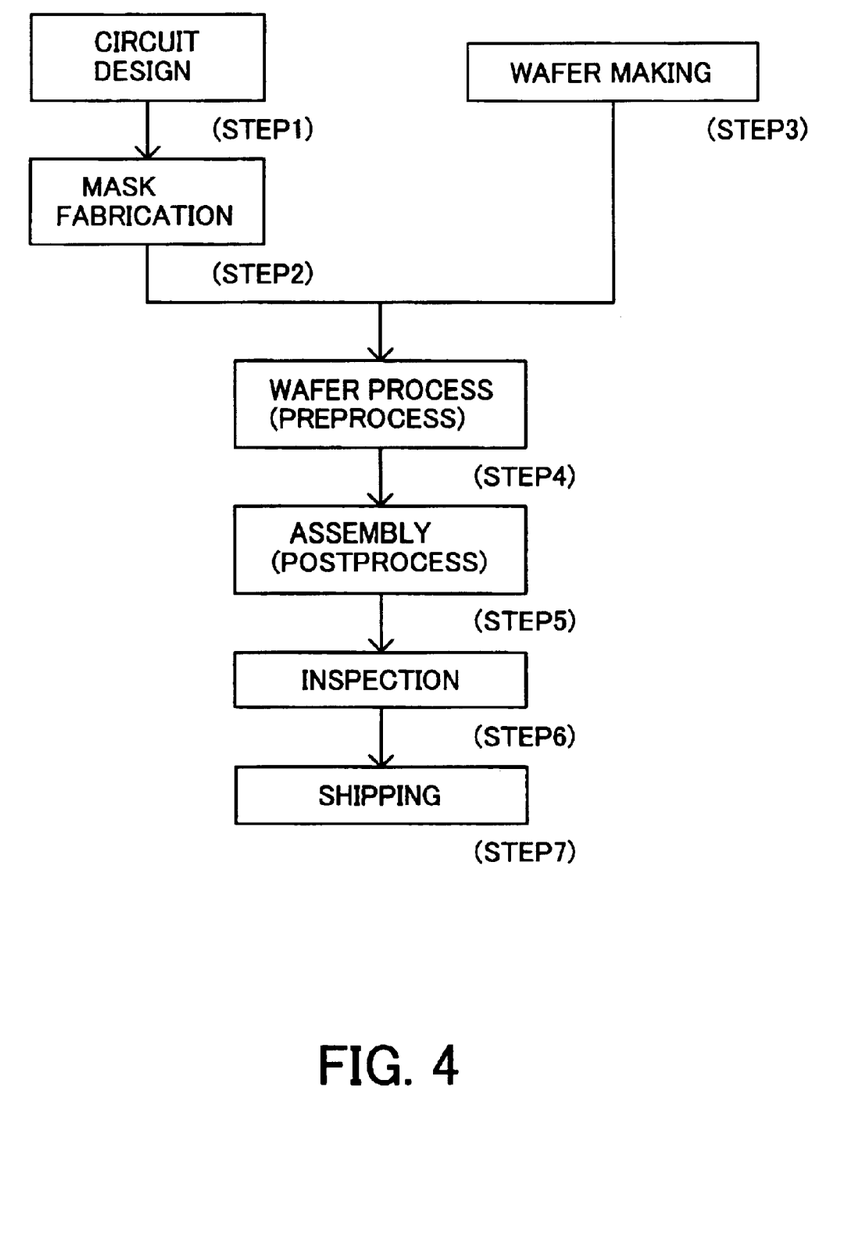
FIG. 4 is a flowchart for explaining a method for fabricating devices (semiconductor chips such as ICs, LSIs, and the like, LCDs, CCDs, etc.).
Figure 5:
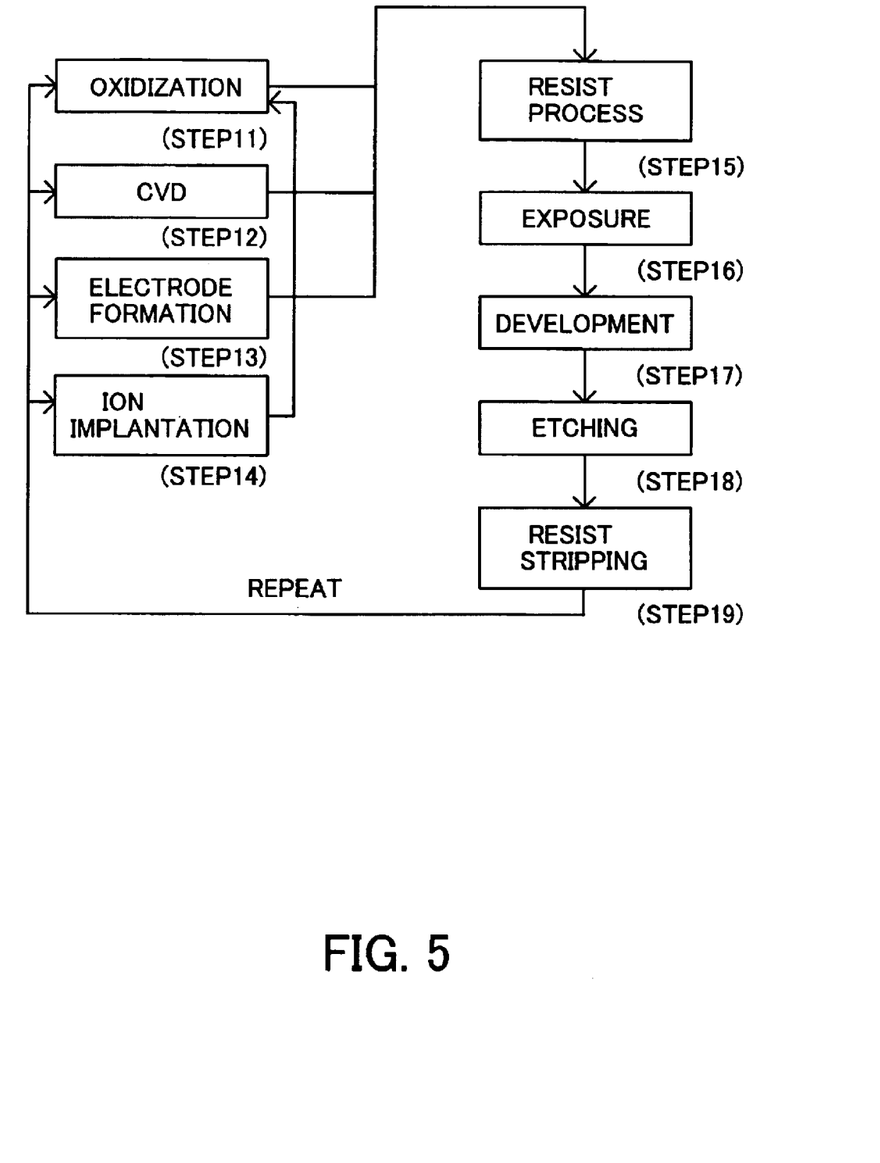
FIG. 5 is a detailed flowchart for Step 4 of wafer process shown in FIG. 4.

Referring to FIGS. 4 and 5, a description will now be given of an embodiment of a device fabricating method using the above mentioned exposure apparatus 200. FIG. 4 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 5 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus 200, and the devices as finished goods also constitute one aspect of the present invention.

Further, the present invention is not limited to these preferred embodiments, and various variations and modifications may be made without departing from the scope of the present invention. For example, the reflection type projection optical system of this embodiment has a coaxial system having a rotationally symmetrical aspheric surface, but it may have a rotationally asymmetrical aspheric surface. The present invention is applicable a reflection type projection optical system for non-EUV ultraviolet light with a wavelength of 200 nm or less, such as ArF excimer laser and $F_2$ excimer laser, as well as to an exposure apparatus that scans and exposes a large screen, or that exposes without scanning.

Thus, the present invention can provide a six-mirror catoptric projection optical system with a high NA and excellent imaging performance, and an exposure apparatus using the same, which are applicable to the EUV lithography, and reduce a maximum effective diameter and an overall length of the optical system.

What is claimed is:

1. A catoptric projection optical system for projecting a reduced size of a pattern on an object surface onto an image surface and for serving as an imaging system that forms an intermediate image between the object surface and image surface, said catoptric projection optical system comprising six or more mirrors,
   wherein a position of an exit pupil with respect to the intermediate image is located between the object surface and image surface, and
   wherein the largest angle between principal rays and an optical axis for angles of view at the position of the exit pupil is $\sin^{-1}\text{NA}$ or smaller, where NA is a numerical aperture at the side of the image surface.

2. A catoptric projection optical system according to claim 1, wherein the numerical aperture is greater than 0.2.

3. A catoptric projection optical system according to claim 1, wherein the mirror that forms the intermediate image is located at a position of an aperture stop.

4. A catoptric projection optical system according to claim 1, wherein the intermediate image is formed on an optical path between a second mirror from the object surface, and a second mirror from the image surface.

5. A catoptric projection optical system according to claim 1, wherein the principal ray for each angle of view at the position of the intermediate image goes away from the optical axis.

6. A catoptric projection optical system according to claim 1, wherein the six or more mirrors form a coaxial system.

7. A catoptric projection optical system according to claim 1, wherein all of the six or more mirrors are aspheric mirrors including a multilayer coating that reflect light having a wavelength of 20 nm or smaller.

8. A catoptric projection optical system according to claim 1, wherein a reflection mask is arranged on the object surface.

9. A catoptric projection optical system according to claim 1, wherein said catoptric projection optical system is non-telecentric at a side of object surface.

10. A catoptric projection optical system according to claim 9, wherein light incident upon a first mirror on an optical path from the object surface has an incident angle between 5° and 10°.

11. A catoptric projection optical system according to claim 1, wherein an exposure area at a side of the image surface has a slit width of 0.8 mm or greater.

12. A catoptric projection optical system according to claim 1, wherein said catoptric projection optical system includes, in order of sequential reflections of light from the object surface, a first mirror, a second mirror, a third mirror, a fourth mirror, a fifth mirror, and a sixth mirror,
   wherein the second mirror, the first mirror, the sixth mirror, the third mirror, and the fifth mirror are arranged in this order from the object surface to the image surface, and
   wherein said catoptric projection optical system forms the intermediate image between the second mirror and the third mirror.

13. A catoptric projection optical system according to claim 1, wherein said catoptric projection optical system includes only six mirrors or reflective surfaces.

14. An exposure apparatus comprising:
   a catoptric projection optical system for projecting a reduced size of a pattern on an object surface onto an image surface and for serving as an imaging system that forms an intermediate image between the object surface and image surface, said catoptric projection optical system including six or more mirrors, wherein a position of an exit pupil with respect to the intermediate image is located between the object surface and image surface, and wherein the largest angle between principal rays and an optical axis for angles of view at the position of the exit pupil is $\sin^{-1}\text{NA}$ or smaller, where NA is a numerical aperture at the side of the image surface;
   a mask stage that supports a mask having the pattern, and positions the pattern on the mask onto the object surface;
   a wafer stage that supports an object having a photosensitive layer, and positions the photosensitive layer on the image surface; and
   a mechanism for synchronously scanning said mask stage and said wafer stage while the mask is illuminated by light having a wavelength of 20 nm or smaller.

15. An exposure apparatus comprising:
   an illumination optical system for illuminating a pattern with light from a light source; and
   a catoptric projection optical system for projecting a reduced size of the pattern on an object surface onto an image surface and for serving as an imaging system that forms an intermediate image between the object surface and image surface, said catoptric projection optical system including six or more mirrors, wherein a position of an exit pupil with respect to the intermediate image is located between the object surface and image surface, and wherein the largest angle between principal rays and an optical axis for angles of view at the position of the exit pupil is $\sin^{-1}NA$ or smaller, where NA is a numerical aperture at the side of the image surface.

16. An exposure apparatus according to claim 15, wherein said projection optical system projects light reflected on the pattern, onto the image surface.

17. A device fabricating method comprising the steps of:

exposing an object using an exposure apparatus; and developing the object that has been exposed, wherein said exposure apparatus includes:

a catoptric projection optical system for projecting a reduced size of a pattern on an object surface onto an image surface and for serving as an imaging system that forms an intermediate image between the object surface and image surface, said catoptric projection optical system including six or more mirrors, wherein a position of an exit pupil with respect to the intermediate image is located between the object surface and image surface, and wherein the largest angle between principal rays and an optical axis for angles of view at the position of the exit pupil is $\sin^{-1}NA$ or smaller, where NA is a numerical aperture at the side of the image surface;

a mask stage that supports a mask having the pattern, and positions the pattern on the mask onto the object surface;

a wafer stage that supports an object having a photosensitive layer, and positions the photosensitive layer on the image surface; and a mechanism for synchronously scanning said mask stage and said wafer stage while the mask is illuminated by light having a wavelength of 20 nm or smaller.

18. A device fabricating method comprising the steps of:

exposing an object using an exposure apparatus; and developing the object that has been exposed, wherein said exposure apparatus includes:

an illumination optical system for illuminating a pattern with light from a light source; and a catoptric projection optical system for projecting a reduced size of the pattern on an object surface onto an image surface and for serving as an imaging system that forms an intermediate image between the object surface and image surface, said catoptric projection optical system including six or more mirrors, wherein a position of an exit pupil with respect to the intermediate image is located between the object surface and image surface, and wherein the largest angle between principal rays and an optical axis for angles of view at the position of the exit pupil is $\sin^{-1}NA$ or smaller, where NA is a numerical aperture at the side of the image surface.

* * * * *